United States Patent [19]

Yamaoka et al.

[11] Patent Number: 6,007,965

[45] Date of Patent: *Dec. 28, 1999

[54] PHOTOPOLYMERIZABLE COMPOSITIONS INCLUDING SQUARYLIUM COMPOUNDS

[76] Inventors: Tsuguo Yamaoka, 3-22-7, Motonakayama, Funabashi-shi, Chiba 273; Kenichi Koseki, 1-9-2-505, Tendai, Inage-ku, Chiba-shi, Chiba 260; Mitsuharu Obara, 1065-13, Ichigao-cho, Midori-ku, Yokohama-shi, Kanagawa 225; Ikuo Shimizu, 3-8-14, Akatsukidai, Yokkaichi-shi, Mie 512; Yukiyoshi Ito, 1-12-5, Nozawa, Setagaya-ku, Tokyo 154; Hitoshi Kawato, 2273-1, Ikuwa-cho, Yokkaichi-shi, Mie 510, all of Japan

[ * ] Notice: This patent is subject to a terminal disclaimer.

[21] Appl. No.: 08/946,353

[22] Filed: Oct. 7, 1997

Related U.S. Application Data

[63] Continuation of application No. 08/386,468, Feb. 10, 1995, Pat. No. 5,756,258, which is a continuation of application No. 08/204,363, Mar. 11, 1994, abandoned, and a continuation-in-part of application No. 08/331,147, Oct. 28, 1994, Pat. No. 5,527,659, which is a continuation of application No. 08/052,999, Apr. 27, 1993, abandoned.

[30] Foreign Application Priority Data

Jul. 13, 1992 [JP] Japan ................................ 3-185224

[51] Int. Cl.$^6$ ...................................................... G03C 1/73
[52] U.S. Cl. ...................... 430/281.1; 430/914; 430/915; 430/916; 430/920; 430/944; 522/16; 522/26
[58] Field of Search ................................ 430/281.1, 914, 430/915, 916, 920, 944; 522/16, 26

[56] References Cited

U.S. PATENT DOCUMENTS

| | | | |
|---|---|---|---|
| 5,190,849 | 3/1993 | Santoh et al. | 430/495 |
| 5,275,917 | 1/1994 | Inaishi et al. | 430/288.1 |
| 5,527,659 | 6/1996 | Yamaoka et al. | 430/179 |

FOREIGN PATENT DOCUMENTS

| | | |
|---|---|---|
| 0379200 | 7/1990 | European Pat. Off. . |
| 2-306247 | 12/1990 | Japan . |

OTHER PUBLICATIONS

Grant, "Hackh's Chemical Dictionary", 4 ed. p. 15, 1969.

*Primary Examiner*—Bernard Codd
*Attorney, Agent, or Firm*—Antonelli, Terry, Stout & Kraus, LLP

[57] ABSTRACT

The present invention relates to photopolymerizable compositions comprising an addition-polymerizable compound which has at least one ethylenically unsaturated double bond; a radical-producing agent and a squarylium compound represented by the formula (I):

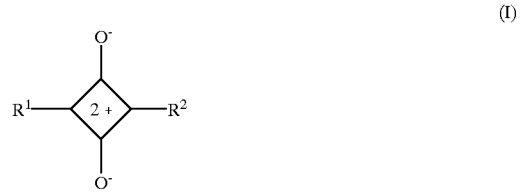

The compositions are highly sensitive to visible and near infrared lights, particularly He-Ne laser, LED, diode laser, etc. having oscillation wavelengths in a wavelength region of 600 nm or more, and thus are useful as materials for holograms, presensitized plate for laser direct process, dry film resists, digital proofs, photosensitive microcapsules.

2 Claims, No Drawings

PHOTOPOLYMERIZABLE COMPOSITIONS INCLUDING SQUARYLIUM COMPOUNDS

This application is a Continuing application of prior application Ser. No. 08/386,468, filed Feb. 10, 1995, now U.S. Pat. No. 5,756,258, which is a Continuation application of application Ser. No. 08/204,363, filed Mar. 11, 1994, now abandoned, and is a Continuation-in-part application of application Ser. No. 08/331,147, filed Oct. 28, 1994, now U.S. Pat. No. 5,527,659, which is a Continuation application of application Ser. No. 08/052,999, filed Apr. 27, 1993, now abandoned.

TECHNICAL FIELD

The present invention relates to photopolymerizable compositions, particularly photopolymerizable compositions having a high sensitivity to visible and near infrared light at a wavelength of 600 nm or more. Also, the present invention relates to novel squarylium compounds.

PRIOR ART

There has been known a photopolymerizable composition comprising an addition-polymerizable compound having at least one ethylenically unsaturated double bond; a squarylium compound represented by the formula:

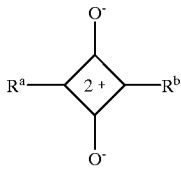

wherein $R^a$ and $R^b$ each are a substituted or unsubstituted aminophenyl group or a group Y=CH— where Y is a nitrogen-containing heterocyclic group; and an s-triazine compound having at least one halogenated methyl group [Japanese Published Unexamined Patent Application No. 306247/90 (EP379200A)].

Further, a squarylium compound represented by the formula:

wherein, $R^{1a}$ and $R^{2a}$ may be the same or different, and each represent a hydrogen atom, an alkyl group, a substituted or unsubstituted aryl group or a substituted or unsubstituted aralkyl group; n represents an integer of 0 to 4; $R^{3a}$ may be the same or different, and represents a halogen atom, an alkyl group, an alkoxy group, a nitro group or a hydroxy group; p represents an integer of 0 to 5; $R^{4a}$ may be the same or different, and represents a halogen atom, an alkyl group, an alkoxy group, a hydroxy group, a nitro group, a cyano group,

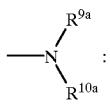

may be the same or different, and each represent an alkyl group; $R^{7a}$ represents an alkyl group, a substituted or unsubstituted aryl group or a substituted or unsubstituted aralkyl group; q represents an integer of 0 to 4; $R^{8a}$ may be the same or different, and represents a halogen atom, an alkyl group, an alkoxy group, a substituted or unsubstituted aryl or a substituted or unsubstituted aralkyl group or two neighboring $R^{8a}$'s may be joined together to form an aromatic ring optionally having (a) substituent(s); and $R^{9a}$ and $R^{10a}$ have the same meanings as $R^{1a}$ (Japanese Published Unexamined Patent Application No. 149263/91). There have been filed applications for squarylium compounds represented by the formula:

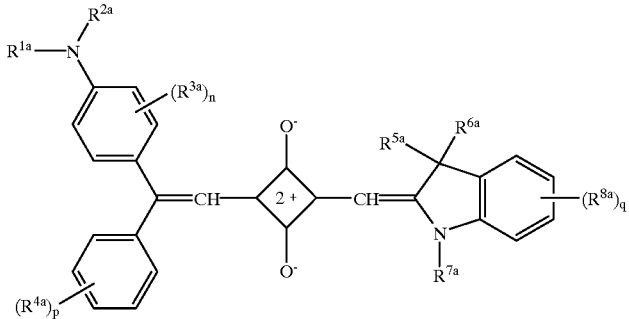

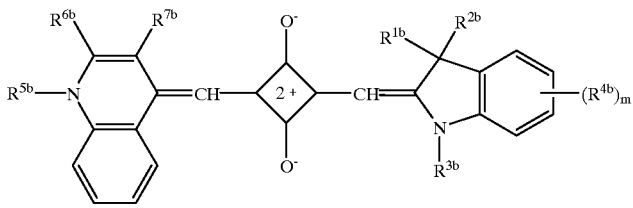

where $R^{1b}$ and $R^{2b}$ may be the same or different and represent an alkyl group, or $R^{1b}$ and $R^{2b}$ may be joined together to form a hydrocarbon ring; $R^{3b}$ represents a hydrogen atom, an alkyl group or an aryl group; m represents an integer of 0 to 4; $R^{4b}$ may be the same or different, and represents a halogen atom, an alkyl group, an aralkyl group, an aryl group or an alkoxy group or two neighboring $R^{4b}$'s may be joined together to form an aromatic ring optionally having (a) substituent(s); $R^{5b}$ represents an alkyl group; and $R^{6b}$ and $R^{7b}$ may be the same or different, and each represent a hydrogen atom, an alkyl group or an aralkyl group, or $R^{6b}$ and $R^{7b}$ are joined together to form an aromatic ring or a hydrocarbon ring optionally having (a) substituent(s) (Japanese Patent Application No. 106399/92); for squarylium compounds represented by the formula;

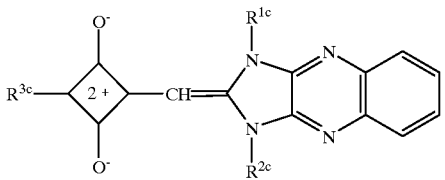

wherein $R^{1c}$ and $R^{2c}$ may be the same or different, and each represent a hydrogen atom, an alkyl group, an aralkyl group or an aryl group; $R^{3c}$ represents a group represented by the formula;

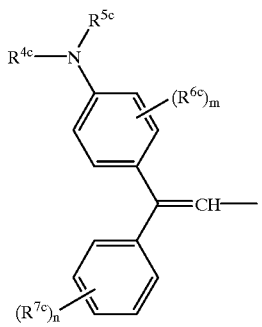

wherein $R^{4c}$ and $R^{5c}$ may be the same or different, and each represent hydrogen, alkyl, substituted or unsubstituted aralkyl or substituted or unsubstituted aryl; m represents an integer of 0 to 4; $R^{6c}$ may be the same or different, and represents a halogen atom, an alkyl group, an alkoxy group, a nitro group or a hydroxy group; n represents an integer of 0 to 5; $R^{7c}$ may be the same or different and represents a halogen atom, an alkyl group, an alkoxy group, a hydroxy group, a nitro group, a cyano group, a trifluoromethyl group or a group: $-NQ^1Q^2$ where $Q^1$ and $Q^2$ may be the same or different, and each are defined in the same manner as $R^{4c}$; or a group represented by the formula:

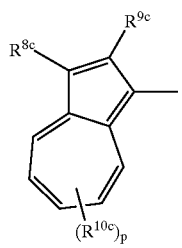

wherein $R^{8c}$ and $R^{9c}$ each represent a hydrogen atom, an alkyl group, an aralkyl group or an aryl group, or $R^{8c}$ and $R^{9c}$ are joined together, to form an aromatic ring, a heterocyclic ring or a hydrocarbon ring optionally having (a) substituent(s); p represents an integer of 0 to 3; $R^{10c}$ may be the same or different and represents an alkyl group, an aralkyl group or an aryl group or two of the neighboring $R^{10c}$'s are joined together to form an aromatic ring, a heterocyclic ring or a hydrocarbon ring optionally having (a) substituent(s);

or a group represented by the formula:

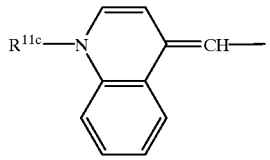

wherein $R^{11c}$ represents an alkyl group (Japanese Patent Application No. 106400/92);

and squarylium compounds represented by the formula:

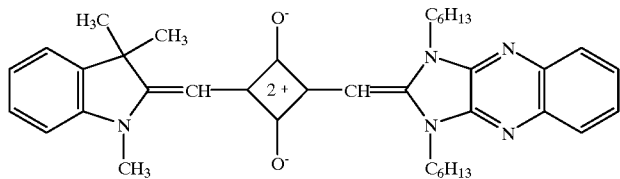

(Japanese Patent Application No. 96173/93)

DISCLOSURE OF THE INVENTION

The present invention relates to photopolymerizable compositions comprising an addition-polymerizable compound which has at least one ethylenically unsaturated double bond, a radical-producing agent and a squarylium compound represented by the formula (I):

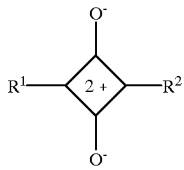
(I)

wherein $R^1$ and $R^2$ may be the same or different, and each represent a group represented by the formula (II):

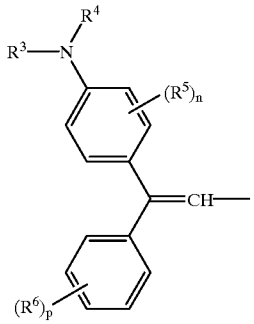
(II)

wherein $R^3$ and $R^4$ may be the same or different, and each represent a hydrogen atom, an alkyl group, a substituted or unsubstituted aryl group or a substituted or unsubstituted aralkyl group; n represents an integer of 0 to 4; $R^5$ may be the same or different, and represents a halogen atom, an alkyl group, an alkoxy group, a nitro group or a hydroxy group; p is an integer of 0 to 5; $R^6$ may be the same or different, and represents a halogen atom, an alkyl group, an alkoxy group, a hydroxy group, a nitro group, a cyano group, a trifluoromethyl group,
a group represented by the formula (III):

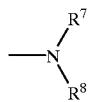
(III)

wherein $R^7$ and $R^8$ may be the same or different, and are defined in the same manner as $R^3$, a group represented by the formula (IV):

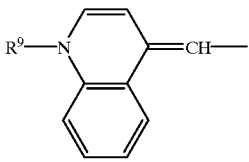
(IV)

wherein $R^9$ represents an alkyl group, a group represented by the formula (V):

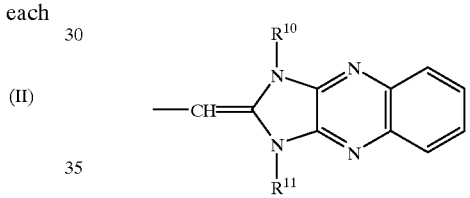
(V)

wherein $R^{10}$ and $R^{11}$ may be the same or different, and each represent a hydrogen atom, an alkyl group, an aralkyl group or an aryl group, or a group represented by the formula (VI):

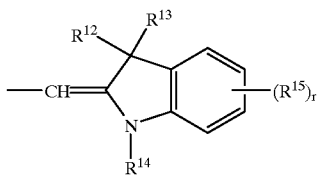
(VI)

wherein $R^{12}$ and $R^{13}$ may be the same or different, and each represent an alkyl group, or $R^{12}$ and $R^{13}$ are joined together to form a hydrocarbon ring optionally having (a) substituent (s); $R^{14}$ represents a hydrogen atom, an alkyl group, an aralkyl group or an aryl group; r is an integer of 0 to 4; $R^{15}$ may be the same or different, and represents a halogen atom, an alkyl group, an aralkyl group, an aryl group or an alkoxy group or two of neighboring $R^{15}$'s are joined together to form an aromatic ring optionally having (a) substituent(s); and novel squarylium compounds represented by the formula (VII):

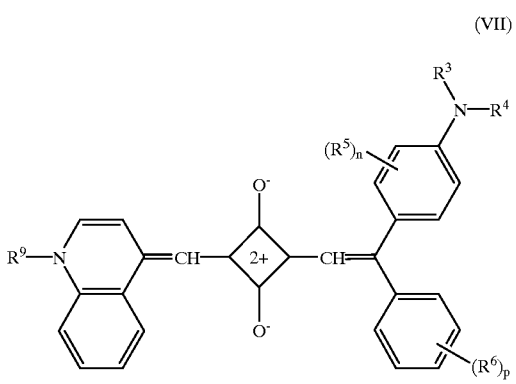

(VII)

wherein $R^3$, $R^4$, $R^5$, $R^6$, $R^9$, n and p have the same meanings as defined above.

In the definitions given above, the alkyl group is exemplified by an alkyl group having from 1 to 6 carbon atoms, e.g., methyl, ethyl, n-propyl, isopropyl, n-butyl, isobutyl, sec-butyl, tert-butyl, n-amyl, isoamyl, sec-amyl, active amyl, tert-amyl, n-hexyl, cyclohexyl, etc.

The aralkyl group includes an aralkyl group having from 7 to 10 carbon atoms, such as benzyl, phenylethyl, phenylpropyl, etc.

The aryl group includes phenyl, naphthyl, etc.

The halogen atom includes chlorine, bromine, fluorine, etc.

The alkyl moiety in the alkoxy group has the same meaning as the alkyl group mentioned above.

The hydrocarbon ring is exemplified by a hydrocarbon ring having from 3 to 7 carbon atoms, including, for example, cyclopropane, cyclobutane, cyclopentane, cyclohexane, cycloheptane, etc.

The substituents for the aryl group, aralkyl group and hydrocarbon ring include halogen, alkyl, alkoxy, etc. Here, the halogen, alkyl and alkoxy have the same meanings as defined above.

The photopolymerizable compositions according to the present invention may be prepared by mixing an addition-polymerizable compound which has at least one ethylenically unsaturated double bond (hereunder referred to as ethylenical compound) with a radical-producing agent, a squarylium compound represented by the formula (I), and, if necessary, a binder polymer, a thermal polymerization inhibitor (e.g., hydroquinone, p-methoxyphenol, etc.), a colorant comprising an organic or inorganic dyeing pigment, a plasticizer, a sensitivity-improving agent (for example, a tert-amine, etc.).

The ethylenical compound is a monomer having an ethylenically unsaturated double bond or a polymer with an ethylenically unsaturated double bond on the main or side chain so that upon irradiation of an active ray to the photopolymerizable composition, the ethylenical compound cures due to addition-polymerization by the action of the radical-producing agent and the photodecomposition product of the squarylium compound, thereby causing insolubility of the ethylenical compound.

The monomer having an ethylenically unsaturated double bond includes, for instance, an unsaturated carboxylic acid, an ester of an unsaturated carboxylic acid and an aliphatic polyhydroxy compound, an ester of an unsaturated carboxylic acid and an aromatic polyhydroxy compound, an ester which is obtained by an esterification reaction of an unsaturated carboxylic acid with a polycarboxylic acid and a polyhydroxy compound.

The unsaturated carboxylic acid is exemplified by acrylic acid, methacrylic acid, itaconic acid, crotonic acid, maleic acid, etc.

The ester of an unsaturated carboxylic acid and an aliphatic polyhydroxy compound includes, for example, acrylic esters, such as ethylene glycol diacrylate, triethylene glycol diacrylate, trimethylol propane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, glycerol acrylate; methacrylic esters, such as triethylene glycol dimethacrylate, trimethylol propane trimethacrylate, trimethylolethane trimethacrylate, pentaerythritol dimethacrylate, pentaerythritol trimethacrylate, pentaerythritol tetramethacrylate, dipentaerythritol dimethacrylate, dipentaerythritol trimethacrylate, dipentaerythritol tetramethacrylate; as well as itaconic esters, crotonic esters and maleic esters of aliphatic polyhydroxy compounds, etc.

The ester of an unsaturated carboxylic acid and aromatic polyhydroxy compound includes, for example, hydroquinone diacrylate, hydroquinone dimethacrylate, resorcin diacrylate, resorcin dimethacrylate, pyrogallic triacrylate, etc.

The ester which is obtained by an esterification reaction of an unsaturated carboxylic acid with a polycarboxylic acid and a polyhydroxy compound includes, for example, an ester of acrylic acid, phthalic acid and ethylene glycol; an ester of acrylic acid, maleic acid and diethylene glycol; an ester of methacrylic acid, terephthalic acid and pentaerythritol; an ester of acrylic acid, adipic acid, butanediol and glycerin.

The compound available for use according to the present invention which has an ethylenically unsaturated double bond include acrylamides such as ethylene bisacrylamide, allyl esters such as diallyl phthalate, including their prepolymers, vinyl group-containing compound such as divinyl phthalate, etc.

The polymer having an ethylenically unsaturated double bond on the main chain includes, for example, polyesters obtained by a polycondensation reaction of an unsaturated dicarboxylic acid with a dihydroxy compound, a polyamide obtained by a polycondensation reaction of an unsaturated dicarboxylic acid with a diamine.

The polymer having an ethylenically unsaturated double bond on the side chain includes, for example, condensation polymers of a dicarboxylic acid having an unsaturated double bond on the side chain, including, e.g., itaconic acid, propylidenesuccinic acid or ethylidene malonic acid with a dihydroxy or diamine compound, etc. Also, polymers comprising a functional group such as hydroxy group or halomethyl group on the side chain, including, e.g., polymers obtained by a polymeric reaction of a polyvinyl alcohol, poly(2-hydroxyethyl methacrylate), an epoxy resin, a phenoxy resin, polyepichlorohydrin or the like with an unsaturated carboxylic acid such as acrylic acid, methacrylic acid, crotonic acid, etc. are available for use.

The radical-producing agent includes s-triazine compounds having at least one trihalomethyl substituent [2,4,6-tris(trichloromethyl)-s-triazine, 2-(4-methoxyphenyl)-4,6-bis(trichloromethyl)-s-triazine, 2-(4-methoxy-1-naphthalenyl)-4,6-bis(trichloromethyl)-s-triazine, etc.], organic peroxides [3,3',4,4'-tetrakis(t-butyldioxycarbonyl) benzophenone, etc.], N-phenylglycines [N-phenylglycine, p-chloro-N-phenylglycine, m-methyl-N-phenylglycine, etc.], aromatic sulfonyl halide compounds [benzenesulfonyl chloride, p-toluenesulfonyl chloride, etc.], imidazole dimers

[2,2'-bis(o-chlorophenyl-4, 4', 5, 5'-tetraphenyl-biimidazole, etc.], metal arene complexes [$PF^-_6$ salt of ($\eta^6$-benzene)($\eta^5$-cyclopentadienyl) iron (II), etc.], titanocene [fluoroaryltitanocene, etc.], diaryl iodonium salts, triaryl sulfonium salts, branched polyethylene imines, etc.

The amount of the radical-producing agent to be used is 1 to 50 parts, preferably 2 to 25 parts, based on 100 parts of the ethylenical compound. The squarylium compound includes the compounds represented by the above formula (I), specifically those listed in Table 1.

TABLE 1

TABLE 1-continued

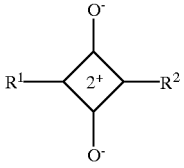

| Compounds | R¹ | R² |
|---|---|---|
| 6 | 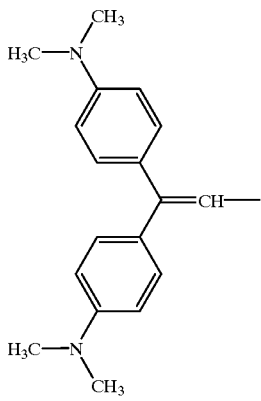 | 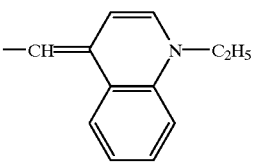 |
| 7 | 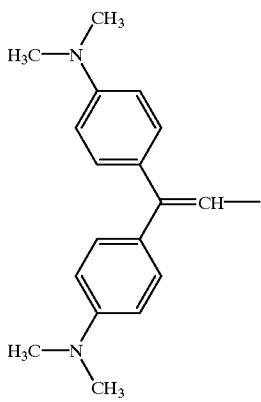 | 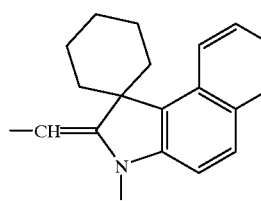 |
| 8 | 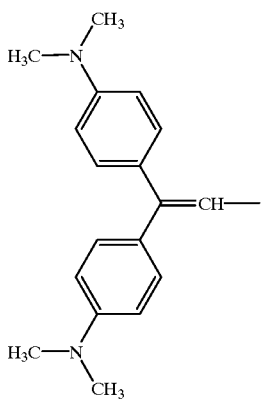 | 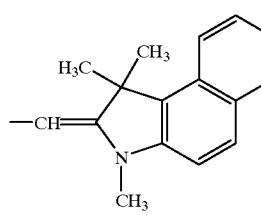 |

Wherein, compounds 1, 2, 3, 4, 5 and 6 correspond to the compounds produced in Reference Examples 1, 2, 3, 4 and 5 and Example 12, respectively. Compound 6 is a novel compound. Compounds 7 and 8 are the compounds described in Japanese Published Unexamined Patent Application No. 149263/91.

Further, the binder polymer includes, for example, polymethacrylic esters or their partial hydrolyzates, polyacrylic esters or their partial hydrolyzates, polystyrene, polyvinyl acetate or its partial hydrolyzates, polyvinyl butyrate, polychloroprene, polyvinyl chloride, chlorinated polyethylene, chlorinated polypropylene, polyvinylpyrrolidone, polyethylene oxide, polymethacrylic acid or methacrylic copolymers with a carboxyl group on the side chain, polyacrylic acid or acrylic copolymers with a carboxyl group on the side chain, polyurethane, polyamide, polycarbonate, acetyl cellulose, polyvinyl carbazole, and other copolymers of acrylic ester, methacrylic ester, maleic acid (anhydride), acrylonitrile, styrene, vinyl acetate, vinyl chloride, vinylidene chloride, butadiene, isoprene, chloroprene, etc.

The amount of the binder polymer to be used is 10 to 1000 parts, preferably 50 to 200 parts, based on 100 parts of the ethylenical compound.

The squarylium compounds represent by the above formula (I) are described in Japanese Published Unexamined Patent Application No. 149263/91, Japanese Patent Application No. 106399/92 and Japanese Patent Application No. 106400/92 and Japanese Patent Application No. 96173/93, and may be obtained by, for example, the following production process:

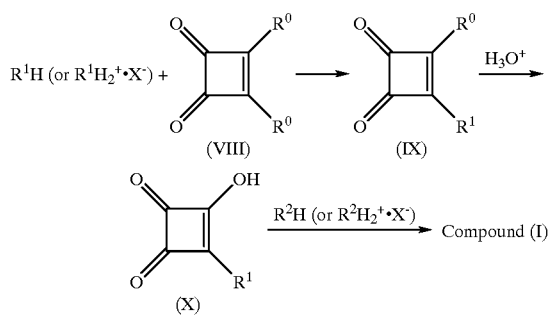

wherein $R^1$ and $R^2$ have the same meanings as defined above, X represents chlorine, bromine, iodine or a group:

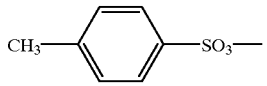

wherein $R^0$ represents chlorine or $OR^{16}$ where $R^{16}$ represents an alkyl of 1 to 4 carbon atoms.

The alkyl having 1 to 4 carbon atoms includes methyl, ethyl, propyl, butyl, etc.

Compound (IX) may be obtained by reacting $R^1H$ or $R^1H_2^+ \cdot X^-$ with an equimolar amount of Compound (VIII), and, if necessary, an equimolar amount of a basic compound or metallic sodium in a solvent at 10 to 35° C. for from 5 minutes to 5 hours.

The basic compound includes triethylamine, quinoline, pyridine, etc. The solvent includes chloroform, dichloromethane, 1,2-dichloroethane, diethyl ether, diisopropyl ether, tetrahydrofuran, toluene, benzene, dimethylformamide, dimethyl sulfoxide, methanol, ethanol, n-propanol, isopropanol, n-butanol, etc.

Compound (IX) may be isolated by evaporating the solvent from the reaction mixture or by filtering the reaction mixture.

Compound (X) may be produced by heating Compound (IX) in 50 to 90% by weight of an aqueous acetic acid at 90 to 110° C. for 1 to 24 hours. Compound (X) may be isolated in the same manner as mentioned above.

Compound (I) may be obtained by reacting Compound (X) with an equimolar amount of Compound $R^2H$ or $R^2H_2^+ \cdot X^-$, and, if necessary, an equimolar to two moles of a basic compound in a solvent at 90 to 110° C. for 1 to 40 hours. The basic compound may be chosen in the same manner as mentioned above. The solvent available for use includes an alcoholic solvent having 4 to 6 carbon atoms or a mixed solvent of a 50% or more alcoholic solvent, and one of benzene and toluene.

Compound (I) may be isolated in the same way as mentioned above, and Compound (I) may be further purified by recrystallization, compelled sedimentation, column chromatography, etc.

The photopolymerizable compositions according to the present invention may be applied to various uses including, for example, printing plates as described in Japanese Published Unexamined Patent Application No. 48665/90, microcapsules as described in Japanese Published Unexamined Patent Application No. 306247/90, and holograms as described in Japanese Published Unexamined Patent Application No. 27436/93.

Hereunder an explanation will be provided with regard to the application to printing plates.

The photopolymerizable composition is coated on a base, and the resulting coating layer is provided with a protecting layer thereon to produce a photosensitive sample. The photosensitive sample is subjected to irradiation of light, unexposed portions of the photosensitive sample are removed with a developer to provide a printing plate.

The base includes sheet materials of paper, paper laminated with plastics (polyethylene, polypropylene, etc.), metals such as copper, aluminum, etc., cellulose acetate, polyethylene, polypropylene, etc. Aluminum sheet is most preferred. If aluminum sheet is used as the base, then preferably its surface is treated by graining and anodic oxidation processing.

The protecting layer includes a polymer with excellent oxygen barrier properties, for example, polyvinyl alcohol, cellulose acetate, etc. in order to prevent the polymerization prohibition effect of oxygen in the air.

The irradiation source includes mercury lamp, chemical lamp, carbon arc lamp, xenon lamp, metal halide lamp, various visible, ultraviolet and near infrared lasers, fluorescent lamp, tungsten light, sunlight, etc. The developer includes inorganic alkali chemicals such as sodium silicate, potassium silicate, sodium hydroxide, potassium hydroxide, tribasic sodium phosphate, dibasic sodium phosphate, tribasic ammonium phosphate, dibasic ammonium phosphate, sodium metasilicate, sodium bicarbonate, sodium carbonate, aqueous ammonia, etc., and aqueous solutions of an organic alkali chemicals such as monoethanolamine, diethanolamine, etc.

BEST MODE FOR CARRYING OUT THE INVENTION

Examples, comparison examples and reference examples are given below.

EXAMPLE 1

In this example, 100 parts of pentaerythritol triacrylate, 100 parts of polymethacrylate polymer (average molecular weight: 150,000), 8 parts of 2,4,6-tris(trichloromethyl)-s-triazine and 1.2 parts of Compound 1 were dissolved in 900 ml of ethylcellosolve to obtain a solution of a photosensitive resin. The solution of a photosensitive resin was coated on an aluminum sheet which had undergone graining and anodic oxidation treatment, to a dry film thickness of 2 μm with a spin coater. Then, the sheet was dried at 80° C. for 2 minutes. An aqueous solution of polyvinyl alcohol (Kuraray Poval 706) was coated on the dried sheet to a dried film thickness of 1.0 μm, to provide an overcoat layer. A step tablet with an optical density step of 0.15 was piled on the resulting photosensitive sample. An irradiation was made for two minutes with a light having a wavelength of around 630 nm (66 μJ/cm$^2$.S) which passed through a heat ray absorption filter HA-30 (manufactured by Hoya), a colored glass filter R-61 and an interference filter KL-63 (both manufactured by Toshiba Glass Co., Ltd.) from a 3 kW ultrahigh pressure mercury lamp.

The developing was made with PS plate developer DN3C (manufactured by Fuji Photo Film Co., Ltd.), and the sample was inked with PS plate developing ink PI-2 (manufactured by Fuji Photo Film Co., Ltd.) for the determination of the energy level necessary for the curing on the basis of the number of the cured steps. The sensitivity was determined to be 0.56 mJ/cm$^2$.

EXAMPLE 2

In the same manner as in Example 1, a light having a wavelength of 610 nm or more (2.37 mJ/cm$^2$.S) which passed through a heat ray absorption filter HA-30 and a colored glass filter R-61 was used instead of a light having a wavelength of around 630 nm (66 μJ/cm$^2$.S) which has passed through a heat ray absorption filter HA-30, a colored glass filter R-61 and an interference filter KL-63. A sensitivity was determined to be 5.9 mJ/cm$^2$.

EXAMPLE 3

In the same manner as in Example 1, 1.2 parts of Compound 2 and a light having a wavelength of 690 nm or more (926 μJ/cm$^2$.S) which passed through a heat ray absorption filter HA-30 and a colored glass filter R-69 (manufactured by Toshiba Glass Co., Ltd.) were used instead of Compound 1 and a light having a wavelength of around 630 nm (66 μJ/cm$^2$.S) which has passed through a heat ray absorption filter HA-30, a colored glass filter R-61 and an interference filter KL-63. A sensitivity was determined to be 3.5 mJ/cm$^2$.

EXAMPLE 4

In the same manner as in Example 1, a light having a wavelength of around 780 nm (162 μJ/cm$^2$.S) which passed through an interference filter KL-78 (manufactured by Toshiba Glass Co., Ltd.) was used instead of a light having a wavelength of around 630 nm (66 μJ/cm$^2$.S) which has passed through a heat ray absorption filter HA-30, a colored glass filter R-61 and an interference filter KL-63. A sensitivity was determined.

EXAMPLE 5

In this example, 100 parts of pentaerythritol triacrylate, 100 parts of polymethacrylate polymer (average molecular weight: 150,000), 8 parts of 2,4,6-tris(trichloromethyl)-s-triazine and 1.2 parts of Compound 2 were dissolved in 900 ml of ethylcellosolve to obtain a solution of a photosensitive resin. The solution of a photosensitive resin was coated on an aluminum sheet which had undergone graining and anodic oxidation treatment, to a dry film thickness of 2 μm with spin coater. Then, the sheet was dried at 80° C. for 2 minutes. An aqueous solution of polyvinyl alcohol (Kuraray Poval 706) was coated on the dried sheet to a dried film thickness of 1.0 μm, to obtain an overcoat layer. A step tablet with an optical density step of 0.15 was piled on the resulting photosensitive sample. An irradiation was made for two minutes with a light having a wavelength of around 780 nm (162 μJ/cm$^2$.S) which passed through an interference filter KL-78 from a 3 kW ultrahigh pressure mercury lamp. The developing was made with PS plate developer DN3C, and the sample was inked with PS plate developing ink PI-2 for the determination of the energy level necessary for the curing on the basis of the number of the cured steps. The sensitivity was determined.

EXAMPLE 6

In the same manner as in Example 1, 8.2 parts of 2,4,6-tris(trichloromethyl)-s-triazine, 0.87 part of Compound 3 and a light having a wavelength of around 680 nm (112 μJ/cm$^2$.S) which passed through a colored glass filter R-66 and an interference filter KL-68 (both manufactured by Toshiba Glass Co., Ltd.) were used instead of 8 parts of 2,4,6-tris(trichloromethyl)-s-triazine, 1.2 parts of Compound 1 and a light having a wavelength of around 630 nm (66 μJ/cm$^2$.S) which passed a colored glass filter R-61 and an interference filter KL-63. A sensitivity was determined to be 1.2 mJ/cm$^2$.

EXAMPLE 7

In the same manner as in Example 1, 1.2 parts of Compound 4 and a light having a wavelength of 690 nm or more (2.25 mJ/cm$^2$.S) which passed through a colored glass filter R-69 (manufactured by Toshiba Glass Company) were used instead of 1.2 parts of Compound 1 and a light having a wavelength of around 630 nm (66 μJ/cm$^2$.S) which passed through a colored glass filter R-61 and an interference filter KL-63. A sensitivity was determined to be 3.1 mJ/cm$^2$.

EXAMPLE 8

In the same manner as in Example 1, 1.0 part of Compound 5 and a light having a wavelength of around 780 nm (198 μJ/cm$^2$.S) which passed through an interference filter KL-78 were used instead of 1.2 parts of Compound 1 and the light having the wavelength of around 630 nm (66 μJ/cm$^2$.S) which passed through a heat ray absorption filter HA-30, a colored glass filter R-61 and an interference filter KL-63. A sensitivity was determined to be 2.3 mJ/cm$^2$.

EXAMPLE 9

In the same manner as in Example 1, 1.0 part of Compound 7 and a light having a wavelength of around 680 nm (131 μJ/cm$^2$.S) which passed through a colored glass filter R-66 and an interference filter KL-68 were used instead of 1.2 parts of Compound 1 and a light having a wavelength of around 630 nm (66 μJ/cm$^2$.S) which passed through a colored glass filter R-61 and an interference filter KL-63. A sensitivity was determined to be 8.7 mJ/cm$^2$.

EXAMPLE 10

In the same manner as in Example 9, 0.99 part of Compound 8 was used instead of 1.0 of Compound 7. A sensitivity was determined to be 7.3 mJ/cm$^2$.

EXAMPLE 11

In the same manner as in Example 1, 8.1 parts of 2,4,6-tris(trichloromethyl)-s-triazine, 1.04 parts of Compound 6 and a light having a wavelength of around 780 nm (207 μj/cm$^2$.S) which passed through an interference filter KL-78 were used instead of 8 parts of 2,4,6-tris (trichloromethyl)-s-triazine, 1.2 parts of Compound 1 and a light having a wavelength of around 630 nm (66 μJ/cm$^2$.S)

which passed through a heat ray absorption filter HA-30, a colored glass filter R-61 and an interference filter KL-63. A sensitivity was determined to be 5.3 mJ/cm².

EXAMPLE 12

To 1.51 g of 3,4-dichloro-3-cyclobutene-1,2-dione was added 30 ml of dichloromethane. Then, a solution of 2.66 g of 1,1-bis(p-dimethylaminophenyl)-ethylene dissolved in 30 ml of dichloromethane was added dropwise to the mixture while cooling on ice in a nitrogen atmosphere. The mixture was stirred at room temperature for 3 hours. The dichloromethane was evaporated from the reaction mixture with a rotary evaporator. Then, 50 ml of acetic acid and 15 ml of water were added to the residue, followed by heating on an oil bath at 100° C.

After heating for 1.5 hours, acetic acid and water were evaporated with a rotary evaporator, followed by addition of 30 ml of chloroform and 250 ml of water to extract the product into the aqueous layer. Further, the aqueous layer was washed twice with 10 ml of chloroform and the aqueous layer was concentrated. Then, 2.99 g of N-ethyllepidinium iodide, 40 ml of n-butanol, 40 ml of benzene and 1.39 ml of triethylamine were added to the concentrate. The mixture was stirred under reflux for 5 hours, removing the water by azeotropy.

Thereafter, 1.0 ml of triethylamine was added to the mixture, and heated under reflux for 32 hours. The solvent and produced water were evaporated by a rotary evaporator. The resulting residue was purified by column chromatography, and crystallized from ethanol to obtain 0.20 g of Compound 6.

M. p.: 221° C. (dec.)

| Elemental analysis: | C | H | N |
|---|---|---|---|
| Calculated (%) | 79.18 | 6.46 | 8.15 |
| Found (%) | 78.72 | 6.35 | 7.99 |

COMPARISON EXAMPLE 1

A photosensitive sample was prepared in the same manner as in Example 5 except that a compound represented by the formula:

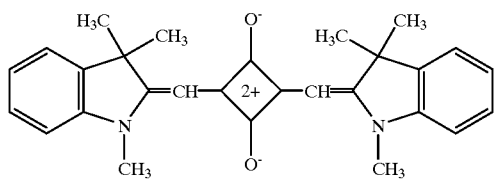

which is described in Japanese Published Unexamined Patent Application No. 306247/90 was used instead of Compound 2. The photosensitive sample did not cure.

COMPARISON EXAMPLE 2

A photosensitive sample was prepared in the same manner as in Example 5 except that a compound represented by the formula:

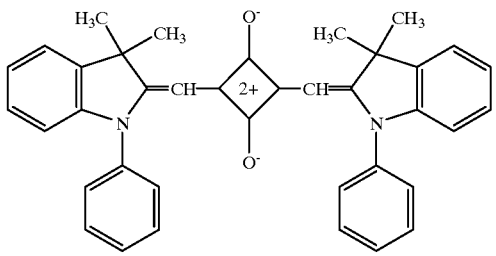

which is described in Japanese Published Unexamined Patent Application No. 306247/90 was used instead of Compound 2. The photosensitive sample did not cure.

REFERENCE EXAMPLE 1

To 0.3 g of 3,4-dichloro-3-cyclobutene-1,2-dione was added 15 ml of dichloromethane. Then, 0.54 g of 1,1-bis(p-dimethylaminophenyl)ethylene was added thereto and the mixture was stirred at room temperature for one hour. The dichloromethane was evaporated from the reaction mixture with a rotary evaporator. To the residue were added 7.6 ml of acetic acid and 10 ml of water. The mixture was heated on an oil bath at 100° C. After heating for 1 hour, the acetic acid and water were evaporated with an rotary evaporator. To the residue were added 20 ml of n-butanol, 20 ml of benzene, 1.05 g of 1,3-di-n-hexyl-2-methylimidazo[4,5-b]quinoxalinium tosylate and 0.27 g of quinoline. The mixture was heated for 2 hours and concentrated with a rotary evaporator. The concentrate was purified by column chromatography to obtain 0.45 g of Compound 1.

M. p.: 147° C. (dec.)

| Elemental analysis: | C | H | N |
|---|---|---|---|
| Calculated (%) | 75.83 | 7.52 | 12.06 |
| Found (%) | 76.13 | 7.54 | 12.26 |

REFERENCE EXAMPLE 2

A mixture of 1.98 g of 3,4-diisopropoxy-3-cyclobutene-1,2-dione, 2.99 g of N-ethyllepidinium iodide and 20 ml of isopropanol was stirred at room temperature. Then, 0.23 g of sodium was added thereto and further stirred for 4 hours. Thereafter, the insoluble matters were filtered off, and the filtrate was concentrated. The residue was purified by column chromatography. To the purified product were added 30 ml of acetic acid and 10 ml of water. The mixture was heated at 90–100° C. for 1.5 hours. After the reaction, the reaction solution was concentrated to dryness. Thereafter, the dried product was heated under reflux for 4 hours together with 13 ml of n-butanol, 0.92 g of 1,3-di-n-butyl-2-ethylimidazo[4,5-b]quinoxalinium chloride and 0.27 g of quinoline. The solvent and the produced water were evaporated with a rotary evaporator. The resulting residue was purified by column chromatography to obtain 0.31 g of Compound 2.

M. p.: 237–238° C. (dec.)

| Elemental analysis: | C | H | N |
|---|---|---|---|
| Calculated (%) | 74.84 | 6.47 | 12.83 |
| Found (%) | 75.13 | 6.52 | 12.94 |

REFERENCE EXAMPLE 3

To 1.5 g of 3,4-dichloro-3-cyclobutene-1,2-dione was added 20 ml of dichloromethane. Then, 1.7 g of 1,3,3- trimethyl-2-methyleneindoline was added dropwise to the mixture with cooling with ice water. After 2 hours, the precipitate was filtered off and dried. To the dried product were added 35 ml of acetic acid and 50 ml of water, followed by heating on an oil bath at 100° C. for 1 hour, then the acetic acid and water were evaporated with a rotary evaporator. Then, 100 ml of n-butanol, 5.25 g of 1,3-di-n-hexyl-2-methylimidazo[4,5-b]quinoxalinium tosylate and 1.01 g of triethylamine were added to the residue, followed by heating under reflux for 3 hours. Then, the reaction mixture was concentrated, and the residue was purified by column chromatography to obtain 3.57 g of Compound 3.

M. p.: 173.5–174.9° C. (dec.)

| Elemental analysis: | C | H | N |
| --- | --- | --- | --- |
| Calculated (%) | 75.59 | 7.51 | 11.60 |
| Found (%) | 73.99 | 7.47 | 11.17 |

REFERENCE EXAMPLE 4

A mixture of 1.98 g of 3,4-diisopropoxy-3-cyclobutene-1,2-dione, 2.99 g of N-ethyllepidinium iodide and 20 ml of isopropanol was stirred at room temperature. Then 0.23 g of sodium was added thereto and the mixture was stirred for 4 hours. Thereafter, the insoluble matters were filtered off, and the filtrate was concentrated. The residue was purified by column chromatography.

To the purified product were added 30 ml of acetic acid and 10 ml of water. The mixture was heated at 90–100° C. for 1.5 hours. After completion of the reaction, the reaction mixture was concentrated to dryness, and to the concentrate were added 0.37 g of 1,3,3-trimethyl-2-methyleneindoline, 21 ml of n-butanol and 21 ml of benzene followed by heating under reflux for 5 hours. The reaction mixture was concentrated, and the residue was purified by column chromatography to obtain 0.24 g of Compound 4.

M. p.: 260–263° C. (dec.)

| Elemental analysis: | C | H | N |
| --- | --- | --- | --- |
| Calculated (%) | 79.59 | 6.20 | 6.63 |
| Found (%) | 79.90 | 6.15 | 6.80 |

REFERENCE EXAMPLE 5

The same manner as in Reference Example 4 was repeated except that 0.72 g of 1,1,2,3-tetramethyl-1H-benz[e]indolium iodide and 0.28 g of quinoline were used instead of the 1,3,3-trimethyl-2-methyleneindoline to obtain 0.17 g of Compound 5.

M. p.: 266–267.6° C. (dec.)

| Elemental analysis: | C | H | N |
| --- | --- | --- | --- |
| Calculated (%) | 81.33 | 5.97 | 5.93 |
| Found (%) | 81.52 | 6.06 | 5.97 |

INDUSTRIAL APPLICABILITY

The photopolymerizable compositions according to the present invention are suitable for use as materials for PS plates for laser direct process, dry film resists, digital proofs, holograms, photosensitive microcapsules, etc.

What is claimed is:

1. A photopolymerizable composition comprising an addition-polymerizable compound which has a least one ethylenically unsaturated double bond, a radical-producing agent and a squarylium compound represented by the formula (I):

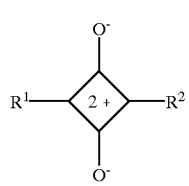

(I)

wherein $R^1$ is a group represented by the formula (II):

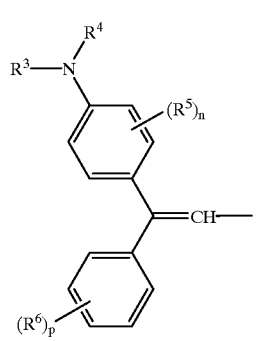

(II)

where $R^3$ and $R^4$ may be the same or different, and each represents a hydrogen atom, an alkyl group, an aryl group or an aralkyl group, said aryl or aralkyl group being unsubstituted or substituted with a halogen atom, an alkyl group or an alkoxy group; n represents an integer of 0 to 4; $R^5$ may be the same or different and represents a halogen atom, an alkyl group, an alkoxy group, a nitro group or a hydroxy group; p is an integer of 0 to 5; $R^6$ may be the same or different and represents a halogen atom, an alkyl group, an alkoxy group, a hydroxy group, a nitro group, a cyano group, a trifluoromethyl group or a group represented by the formula (III):

(III)

wherein $R^7$ and $R^8$ may be the same or different, and each is defined in the same manner as $R^3$; and $R^2$ is a group represented by the formula (IV):

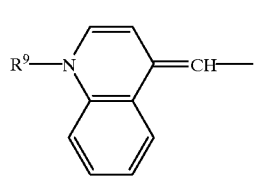

(IV)

wherein $R^9$ represents an alkyl group; or a group represented by the formula (V):

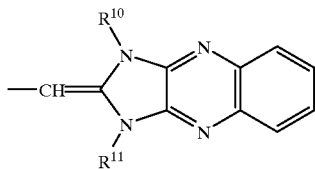

(V)

wherein $R^{10}$ and $R^{11}$ may be the same or different, and each represents a hydrogen atom, an alkyl group, an aralkyl group or an aryl group.

2. A photopolymerizable composition comprising an addition-polymerizable compound which has at least one ethylenically unsaturated double bond, a radical-producing agent and a squarylium compound represented by the formula (I):

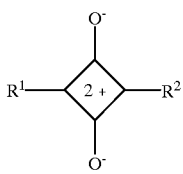

(I)

wherein $R^1$ is a group represented by the formula (IV):

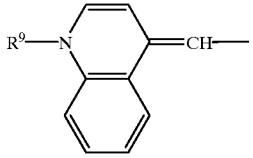

(IV)

wherein $R^9$ represents an alkyl group; and $R^2$ is a group represented by the formula (V):

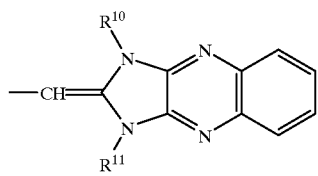

(V)

wherein $R^{10}$ and $R^{11}$ may be the same or different, and each represents a hydrogen atom, an alkyl group, an aralkyl group or an aryl group;

or a group represented by the formula (VI):

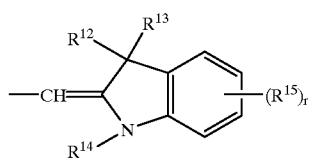

(VI)

wherein $R^{12}$ and $R^{13}$ may be the same or different, and each represents an alkyl group, or $R^{12}$ and $R^{13}$ together with the carbon atom to which they are bonded form a hydrocarbon ring, said hydrocarbon ring being unsubstituted or substituted with at least one of a halogen atom, an alkyl group or an alkoxy group; $R^{14}$ represents a hydrogen atom, an alkyl group, an aralkyl group or an aryl group; r is an integer of 0 to 4; $R^{15}$ may be the same or different and represents a halogen atom, an alkyl group, an aralkyl group, an aryl group or an alkoxy group provided that when r is an integer of 2 to 4, two adjacent $R^{15}$'s may form an aromatic ring being unsubstituted or substituted with at least one of a halogen atom, an alkyl group or an alkoxy group.

* * * * *